(12) United States Patent
Park et al.

(10) Patent No.: US 9,865,670 B2
(45) Date of Patent: Jan. 9, 2018

(54) FLEXIBLE DISPLAY DEVICE AND MANUFACTURING METHOD THEREOF

(71) Applicant: Samsung Display Co., Ltd., Yongin-si, Gyeonggi-do (KR)

(72) Inventors: Hye Kyung Park, Yongin-si (KR); Young Su Kim, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/212,859

(22) Filed: Jul. 18, 2016

(65) Prior Publication Data

US 2017/0040406 A1 Feb. 9, 2017

(30) Foreign Application Priority Data

Aug. 6, 2015 (KR) .......................... 10-2015-0111136

(51) Int. Cl.
| | | |
|---|---|---|
| *H01L 27/00* | (2006.01) | |
| *H01L 51/00* | (2006.01) | |
| *H05K 3/10* | (2006.01) | |
| *H01L 27/32* | (2006.01) | |
| *H05K 1/02* | (2006.01) | |
| *H01L 51/56* | (2006.01) | |

(Continued)

(52) U.S. Cl.
CPC ...... *H01L 27/3276* (2013.01); *H01L 51/0097* (2013.01); *H01L 51/56* (2013.01); *H05K 1/028* (2013.01); *H01L 27/1218* (2013.01); *H01L 27/3258* (2013.01); *H01L 2227/323* (2013.01); *H01L 2251/5338* (2013.01); *H05K 3/0017* (2013.01); *H05K 2201/055* (2013.01); *H05K 2201/10128* (2013.01)

(58) Field of Classification Search
CPC ............... H01L 27/3276; H01L 27/288; H01L 27/3202; H01L 27/1218; H01L 2227/323; H01L 2251/5338; H01L 51/0097; H01L 51/56; H01L 51/5253; H05K 1/028; H05K 3/0017; H05K 3/10; H05K 2201/055; H05K 2201/10128
See application file for complete search history.

(56) References Cited

U.S. PATENT DOCUMENTS

| | | | |
|---|---|---|---|
| 8,304,282 B2 | 11/2012 | Kim et al. | |
| 2010/0304521 A1* | 12/2010 | Seutter | H01L 31/046 438/71 |

(Continued)

FOREIGN PATENT DOCUMENTS

| | | |
|---|---|---|
| KR | 10-2012-0009682 | 2/2012 |
| KR | 10-2014-0045193 | 4/2014 |

(Continued)

*Primary Examiner* — Nikolay Yushin
(74) *Attorney, Agent, or Firm* — Knobbe Martens Olson & Bear, LLP

(57) ABSTRACT

A flexible display device includes: a flexible substrate including a bending area; an insulating layer formed on the flexible substrate and including at least one cutout formed to correspond to the bending area; and a plurality of wires formed along a surface shape of the insulating layer in the bending area. The at least one cutout may include an inclined lateral wall, and a width of the inclined lateral wall may be equal to or greater than a depth of the cutout.

17 Claims, 17 Drawing Sheets

(51) Int. Cl.
*H05K 3/00* (2006.01)
*H01L 27/12* (2006.01)

(56) References Cited

U.S. PATENT DOCUMENTS

2014/0217382 A1* 8/2014 Kwon ................. H01L 51/0097
 257/40
2014/0232956 A1* 8/2014 Kwon ............... G02F 1/133305
 349/12

FOREIGN PATENT DOCUMENTS

KR 10-2014-0103025 8/2014
KR 10-2014-0140150 12/2014

* cited by examiner

FLEXIBLE DISPLAY DEVICE AND MANUFACTURING METHOD THEREOF

RELATED APPLICATIONS

This application claims priority to, and the benefit of, Korean Patent Application No. 10-2015-0111136 filed in the Korean Intellectual Property Office on Aug. 6, 2015, the entire contents of which are incorporated herein by reference.

BACKGROUND

Field

The described technology relates generally to a flexible display device having a bending area.

Description of the Related Technology

Since an organic light emitting diode display with a self-luminous characteristic does not need a separate light source, unlike a liquid crystal display, it can have a relatively small thickness and weight. In addition, the organic light emitting diode display exhibits high-quality characteristics, such as, for example, low power consumption, high luminance, and high response speed.

A typical organic light emitting diode display includes a substrate, a thin film transistor formed on the substrate, an organic light emitting diode, light emission of which is controlled by the thin film transistor, and a plurality of insulating layers disposed between electrodes that form the thin film transistor. Recently, a flexible organic light emitting diode display that includes a flexible substrate and in which a bending area is formed, has been developed.

The above information disclosed in this Background section is only to enhance the understanding of the background of the described technology and therefore it may contain information that does not form the prior art that is already known in this country to a person of ordinary skill in the art.

SUMMARY OF CERTAIN INVENTIVE ASPECTS

The described technology has been made in an effort to provide a flexible display device and a manufacturing method thereof that can effectively prevent cracking in an insulating layer and a short circuit between wires from occurring due to bending of the flexible display device.

One embodiment provides a flexible display device including: a flexible substrate including a bending area; an insulating layer formed on the flexible substrate and including at least one cutout formed to correspond to the bending area; and a plurality of wires formed along a surface shape of the insulating layer in the bending area. The at least one cutout may include an inclined lateral wall, and a width of the inclined lateral wall may be equal to or greater than a depth of the cutout.

The inclined lateral wall may have a convex shape toward the flexible substrate. The inclined lateral wall may include a first lateral wall and a second lateral wall that are spaced apart from each other, and a bottom surface of the at least one cutout may be disposed between the first lateral wall and the second lateral wall. The plurality of wires may be formed along a top surface of the insulating layer, the first lateral wall, the bottom surface, the second lateral wall, and the top surface of the insulating layer.

A plurality of cutouts may be formed, and the plurality of cutouts may be spaced apart from each other along a length direction of the plurality of wires. The bending area may be bent based on a bending axis, and the at least one cutout may be extendedly formed along a direction parallel to the bending axis. The at least one cutout may be formed by isotropic etching using an etching paste.

The flexible substrate may include a display area and a non-display area, and the bending area may be included in the non-display area. The flexible display device may further include a display unit formed in the display area on the flexible substrate, The plurality of wires may be electrically connected to a plurality of signal lines included in the display unit.

The flexible display device may further include a driving integrated circuit and a plurality of pad electrodes formed in the non-display area and electrically connected to the plurality of wires. The driving integrated circuit and the plurality of pad electrodes may overlap the display unit in a rear side of the display unit by the bending area.

The insulating layer may include a multi-layered inorganic layer, and the at least one cutout may be formed in at least one layer including a topmost layer of the multi-layered inorganic layer. The insulating layer of the non-display area and the plurality of wires may be covered by a passivation layer including an organic material.

Another embodiment provides a flexible display device including: a display area in which a display unit is formed; a bending area contacting one side of the display area; and a data driver area contacting one side of the bending area and overlapping the display area. An insulating layer including a cutout and a plurality of wires formed along a surface shape of the insulating layer may be disposed in the bending area. The cutout may include an inclined lateral wall, and a width of the lateral wall may be equal to or greater than a depth of the cutout.

The bending area may be bent based on a bending axis, the cutout may be extendedly formed along a direction parallel to the bending axis, and the lateral wall may have a downward facing convex shape.

A further embodiment provides a manufacturing method of a flexible display device, including: forming an insulating layer on a flexible substrate; forming a cutout in the insulating layer by using an etching paste; forming a plurality of wires along a surface shape of the insulating layer in which the cutout is formed; and forming a bending area by bending a portion of the flexible substrate in which the cutout is formed.

The cutout may be formed by an isotropic etching with the etching paste, and a depth of the cutout may be controlled by adjusting an etching time of the etching paste.

The cutout may include an inclined lateral wall, and a width of the lateral wall is equal to or greater than the depth of the cutout. The lateral wall may have a convex shape toward the flexible substrate. The bending area may be bent based on a bending axis, and the cutout may be extendedly formed along a direction parallel to the bending axis.

According to various embodiments, it is possible to effectively prevent cracking in an insulating layer and a short circuit between wires from occurring due to bending of the flexible display device.

DETAILED DESCRIPTION OF CERTAIN INVENTIVE EMBODIMENTS

Figure 1:
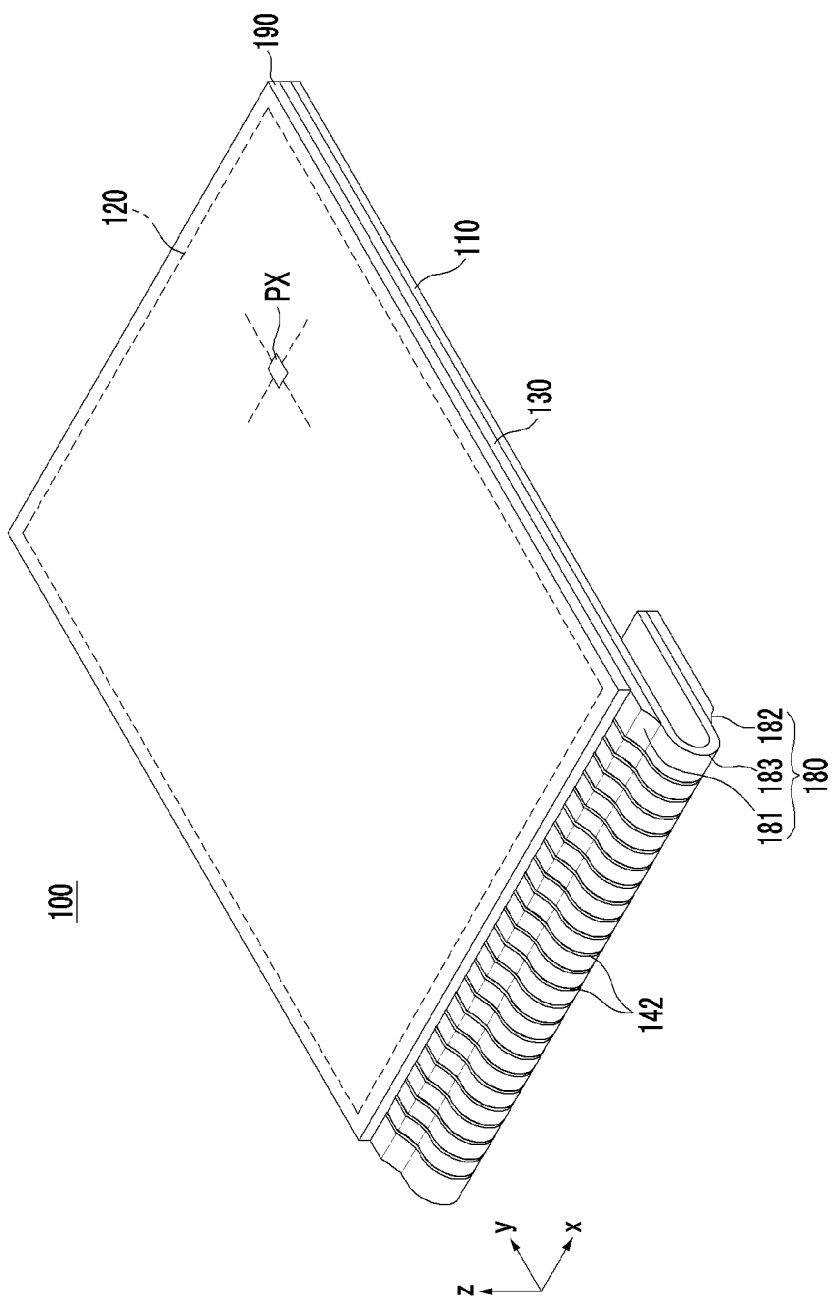
FIG. 1 illustrates a schematic perspective view of a flexible display device according to an embodiment.

The present disclosure will be described more fully hereinafter with reference to the accompanying drawings, in which certain embodiments of the disclosure are shown. As those skilled in the art would realize, the described embodiments may be modified in various ways, without departing from the spirit or scope of the present disclosure.

Throughout the specification, it will be understood that when an element such as a layer, film, region, or substrate is referred to as being "on" another element, it may be directly on the other element or intervening elements may also be present. Further, the word "on" means positioned on or below the object portion, and does not necessarily mean positioned on the upper side of the object portion based on a gravitational direction.

Throughout the specification, unless explicitly described to the contrary, the word "comprise" will be understood to imply the inclusion of stated elements, but not the exclusion of any other elements. In the drawings, the sizes and thicknesses of respective elements are arbitrarily illustrated for ease of description, and the present disclosure is not necessarily limited to such illustrated size and thickness.

Figure 2:
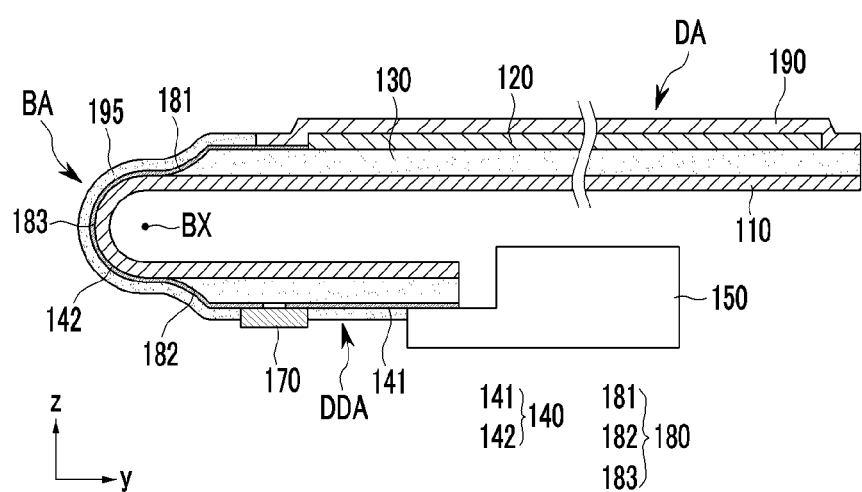
FIG. 2 illustrates a schematic cross-sectional view of a flexible display device according to an embodiment.
Figure 3:
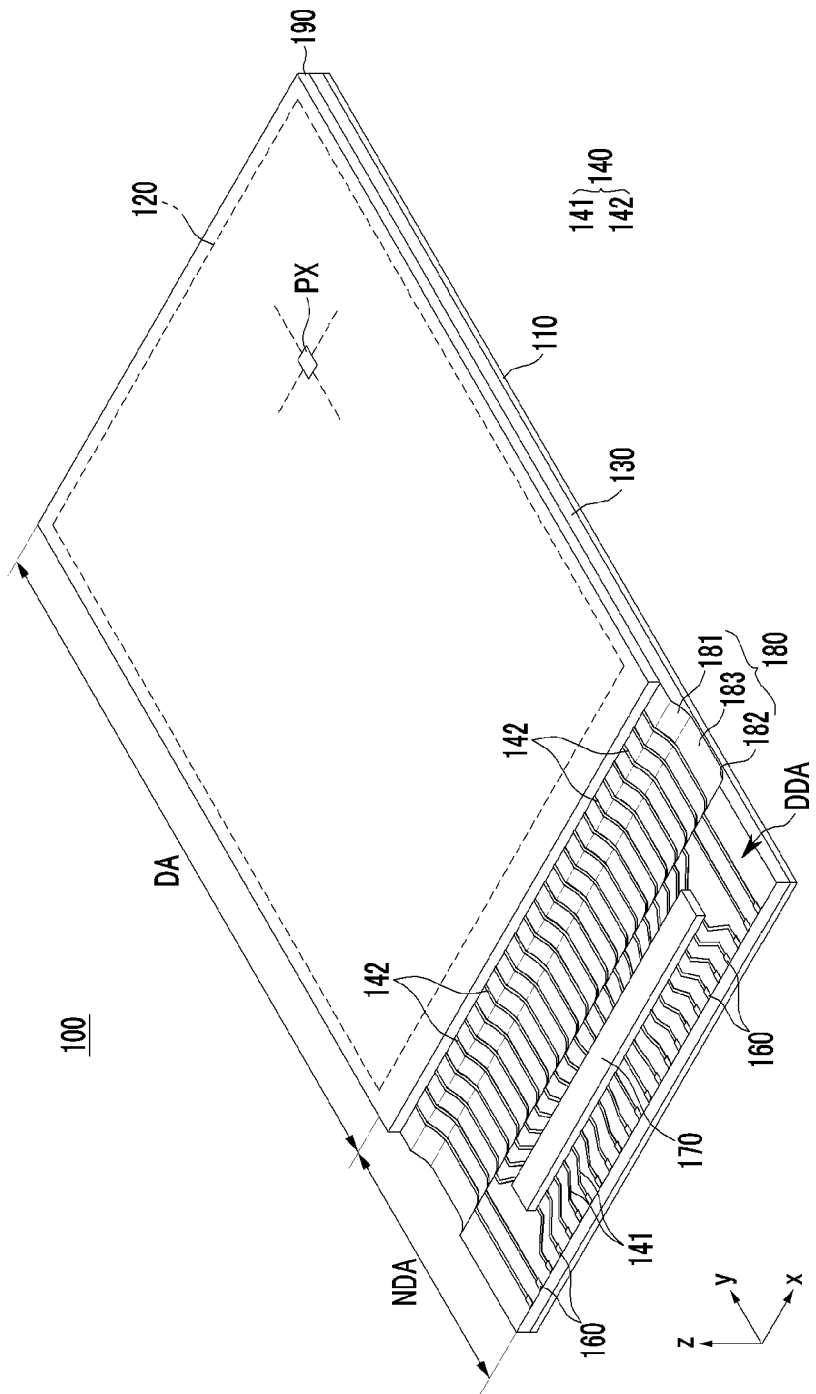
FIG. 3 is a schematic perspective view illustrating an unfolded state of the flexible display device shown in FIG. 1.
Figure 4:
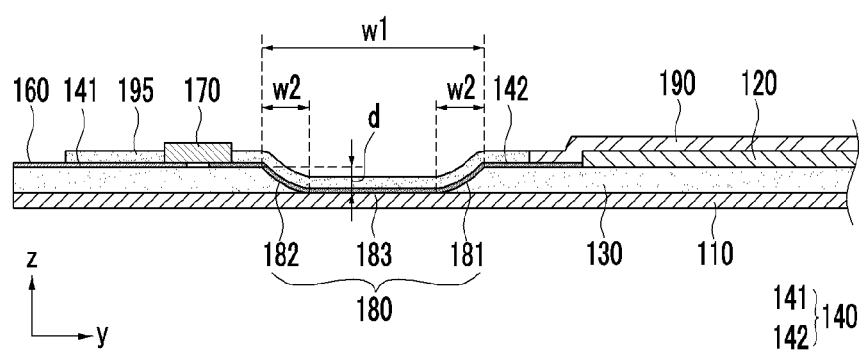
FIG. 4 is a schematic cross-sectional view illustrating an unfolded state of the flexible display device shown in FIG. 2.

FIGS. 1 and 2 respectively illustrate a schematic perspective view and a schematic cross-sectional view of a flexible display device according to an embodiment, and FIGS. 3 and 4 each is a schematic perspective view and a schematic cross-sectional view respectively illustrating unfolded states of the respective flexible display devices shown in FIGS. 1 and 2.

Referring to FIGS. 1 to 4, a flexible display device 100 of an embodiment includes a flexible substrate 110, a display unit 120 formed on the flexible substrate 110, an insulating layer 130, and a plurality of wires 140. Further, the flexible display device 100 includes an external driver 150, such as a printed circuit board (PCB).

The flexible substrate 110 may include an organic material including at least one of polyimide, polycarbonate, polyethylene, polyethylene terephthalate, or polyacrylate. The flexible substrate 110 may have a light-transmitting property, and is bent by an external force. The flexible substrate 110 includes a display area (DA) in which the display unit 120 is formed and a non-display area (NDA) formed outside the display area (DA).

The display unit 120 includes a plurality of pixels PX, and displays an image by a combination of light emitted from the plurality of pixels PX. The respective pixels PX include a pixel circuit and an organic light emitting diode. The pixel circuit includes at least two thin film transistors and at least one storage capacitor, and controls light emission of an organic light emitting diode. A detailed structure of the display unit 120 is described below.

A plurality of pad electrodes 160 and a plurality of wires 140 are formed in the non-display area (NDA) of the flexible substrate 110. The plurality of pad electrodes 160 are formed on an edge of the flexible substrate 110, and the plurality of wires 140 connect the plurality of pad electrodes 160 and a plurality of signal lines (including, for example, scan lines, data lines, and driving voltage lines, and the like) formed on the display unit 120.

The plurality of pad electrodes 160 are connected to an output wire of the driver 150. The driver 150 outputs various signals and power for the display to the plurality of pad electrodes 160.

A driving integrated circuit 170 may be mounted on the non-display area (NDA) of the flexible substrate 110. The driving integrated circuit 170 may be mounted on the flexible substrate 110 in a chip on plastic (COP) method using an anisotropic conductive film. The driving integrated circuit 170 may be a data driver. However, the function of the driving integrated circuit 170 is not limited to the data driver.

When the driving integrated circuit 170 is mounted on the flexible substrate 110, the plurality of wires 140 may be divided into a plurality of input wires 141 connecting the plurality of pad electrodes 160 and the driving integrated circuit 170, and a plurality of output wires 142 connecting the driving integrated circuit 170 and the display unit 120.

When the non-display area (NDA) is disposed to be parallel to the display area (DA) (refer to FIG. 3), dead space outside the display unit 120 increases. The bending area (BA) is included in the non-display area (NDA). The bending area (BA) is bent based on a bending axis, and a curvature center of the bending area (BA) is positioned at the bending axis (BX). The bending axis (BX) is parallel to an x-axis with reference to FIGS. 1 and 2.

The bending area (BA) may be an area included between the display unit 120 and the driving integrated circuit 170, for example, an area in which the plurality of output wires 142 are disposed, within the non-display area (NDA). The driving integrated circuit 170 and the plurality of pad electrodes 160 overlap the display unit 120 at a rear side of the display unit 120 by the bending area (BA). The flexible display device 100 of an embodiment may minimize the dead space outside the display unit 120 by the bending area (BA).

The remaining area in the flexible substrate 110, except for the bending area (BA), may be flat, and the remaining area in the non-display area (NDA), except for the bending area (BA), may be referred to as a 'data driver area (DDA).'

The insulating layer 130 is formed on the entire flexible substrate 110, and the plurality of wires 140 is formed on the insulating layer 130. The insulating layer 130 is disposed between the electrodes forming the thin film transistors included in the display unit 120 to insulate the electrodes. The insulating layer 130 may comprise multiple layers, including a barrier layer, a buffer layer, a gate insulating layer, an interlayer insulating layer, and the like, and including an inorganic material such as, for example, a silicon oxide ($SiO_2$) or silicon nitride (SiNx). The plurality of wires 140 includes metal.

The insulating layer 130 is less flexible than the plurality of wires 140, and has a brittle characteristic so that it may be broken by an external force. Accordingly, the insulating layer 130 of the bending area (BA) may be broken by tensile force caused by bending, such that a crack may occur, and an initially occurring crack may spread to other areas of the insulating layer 130. A crack in the insulating layer 130 causes a cutoff of the wire, which leads to display defects in the flexible display device 100.

The insulating layer 130 includes a cutout 180 formed on the bending area (BA). The cutout 180 may be extendedly formed in the bending area (BA) along the direction (x-axis direction) parallel to the bending axis (BX) with a predetermined constant width. As the cutout 180 is formed in the insulating layer 130 of the bending area (BA), the occurrence of cracking in the insulating layer 130 due to the bending stress may be suppressed, and the cutoff of the wires 140 due to the cracking in the insulating layer 130 may also be prevented.

FIGS. 1 to 4 illustrate an embodiment in which one cutout 180 is formed in the bending area (BA). When one cutout 180 is formed in the bending area (BA), a width w1 (refer to FIG. 4) of the cutout 180 may be equal to or greater than a width of the bending area (BA) measured at a top surface of the flexible substrate 110. However, the width w1 of the cutout 180 is not limited thereto.

The cutout 180 includes two inclined lateral walls (first and second lateral walls) 181 and 182, and a bottom surface 183 disposed between the two lateral walls 181 and 182. The plurality of output wires 142 is formed on the insulating layer 130 along a surface shape of the insulating layer 130, in which the cutout 180 is formed. For example, the plurality of output wires 142 are extendedly formed along a top surface of the insulating layer 130, a first lateral wall 181, a bottom surface 183, and a second lateral wall 182 and insulating layer 130, between the driving integrated circuit 170 and the display unit 120.

In FIGS. 3 and 4, each length direction of the plurality of output wires 142 is substantially identical to a width direction (y-axis direction) of the cutout 180.

The first and second lateral walls 181 and 182 of the cutout 180 are not formed of a vertical lateral wall, but are formed of an inclined lateral wall, and each width w2 (refer to FIG. 4) of the first and second lateral walls 181 and 182 is equal to or greater than a depth (d) (refer to FIG. 4) of the cutout 180. For example, each width w2 of the first and second lateral walls 181 and 182 may be about 10 to about 50 times the depth (d) of the cutout 180.

As such, the first and second lateral walls 181 and 182 of the cutout 180 are gently inclined lateral walls, and as a ratio of each width w2 of the first and second lateral walls 181 and 182 with respect to the depth (d) of the cutout 180 increases, the first and second lateral walls 181 and 182 become very gently inclined lateral walls. Accordingly, the plurality of output wires 142 formed along the surface shape of the cutout 180 may prevent a short circuit from occurring in a patterning process.

The plurality of wires 140 is formed by depositing a metal layer on the insulating layer 130 of the non-display area (NDA) and then by patterning the metal layer through a photolithography process in addition to a dry etching process. If the metal layer remains between undesired areas, that is, the plurality of wires 140, since a short circuit may occur between the wires 140, a signal may not be accurately transmitted to the display unit 120.

The display unit 120 is sealed by the sealing part 190 so as to not contact the outside air, and the insulating layer 130 of the non-display area (NDA) and the plurality of wires 140 are covered by a passivation layer 195 in order to be protected.

Figure 5A:
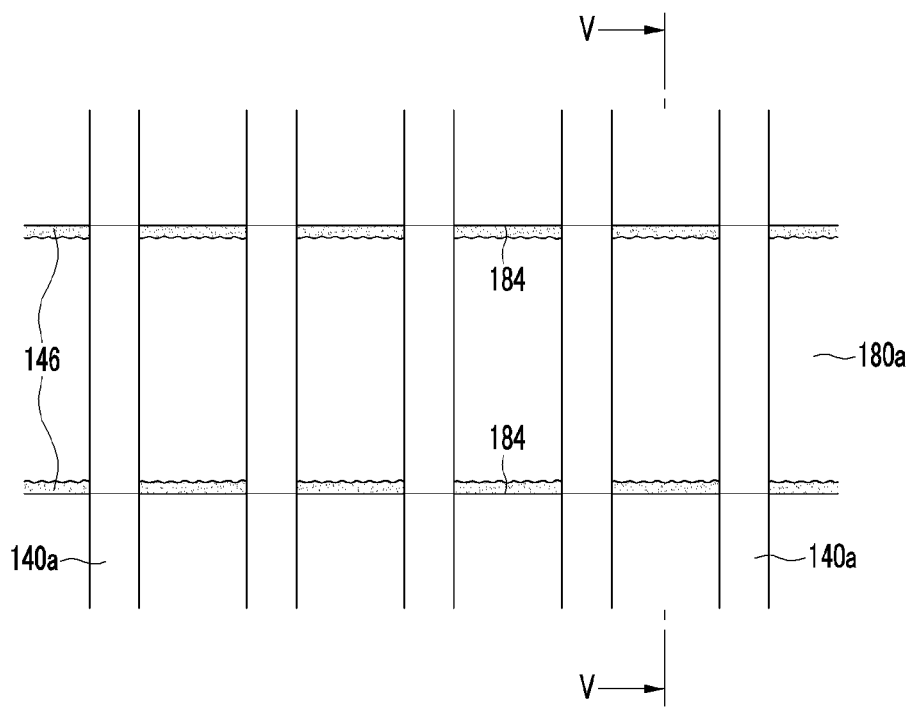
FIG. 5A illustrates a partial top plan view of a non-display area of a flexible display device according to a comparative example.
Figure 5B:
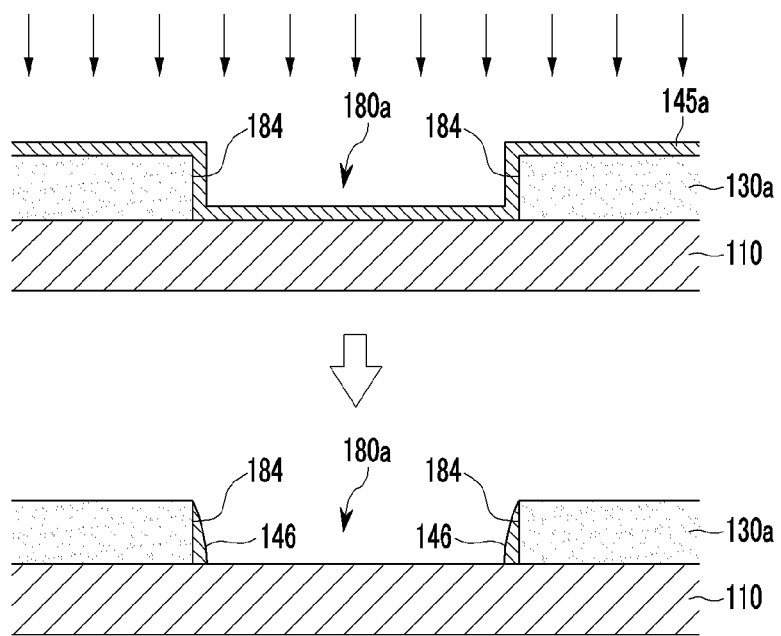
FIG. 5B illustrates a schematic cross-sectional view of the flexible display device of FIG. 5A taken along line V-V.

FIG. 5A illustrates a partial top plan view of a non-display area of a flexible display device according to a comparative example, and FIG. 5B illustrates a schematic cross-sectional view of the flexible display device of FIG. 5A taken along line V-V. In FIGS. 5A and 5B, it is assumed that a flexible substrate is flat before a bending area is formed.

Referring to FIGS. 5A and 5B, in a flexible display device of a comparative example, an insulating layer 130a includes a cutout 180a formed in the non-display area (NDA), and the cutout 180a includes two vertical lateral walls 184. In this case, when a plurality of wires 140a are formed by partially removing the metal layer 145a by dry etching after depositing a metal layer 145a and forming a photoresist mask (not shown) on the insulating layer 130a, a portion of the metal layer 145a is not removed and remains around the vertical lateral walls 184. In FIGS. 5A and 5B, reference numeral 146 denotes the remaining metal.

An etching direction is set in one direction (a vertical direction of FIG. 5B) in the dry etching, unlike in wet etching, and since a portion of the metal layer 145a that contacts the vertical lateral wall 184 has a greater thickness than that of the remaining portion of the metal layer 145a, although the remaining portion of metal layer 145a is entirely removed, the portion of the metal layer 145a that contacts the vertical lateral wall 184 may remain. As such, a remaining metal 146 contacts two adjacent wires 140a to cause a short circuit between the wires 140a.

Figure 5C:
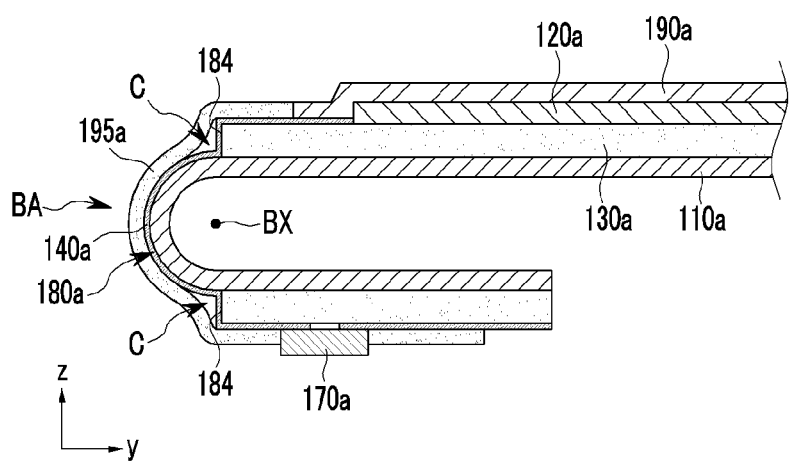
FIG. 5C is a schematic cross-sectional view illustrating a bending area of a flexible display device according to a comparative example.

FIG. 5C is a schematic cross-sectional view illustrating a bending area of a flexible display device according to the comparative example.

Referring to FIG. 5C, the insulating layer 130a of the non-display area (NDA) and the plurality of wires 140a are covered by a passivation layer 195a including an organic material, and when the bending area (BA) is formed in a flexible substrate 110a as a comparative example, the passivation layer 195a may come off due to a steep slope of the vertical lateral wall 184 of the cutout 180a.

For example, some of the passivation layer 195a may be separated from the insulating layer 130a and the plurality of wires 140a. In FIG. 5C, the portion that the passivation layer 195a is separated is pointed out by the C arrow. In this case, moisture and oxygen contained in the outside air penetrate the portion of the passivation layer 195a that comes off, such that the passivation layer 195a deteriorates.

Figure 6A:
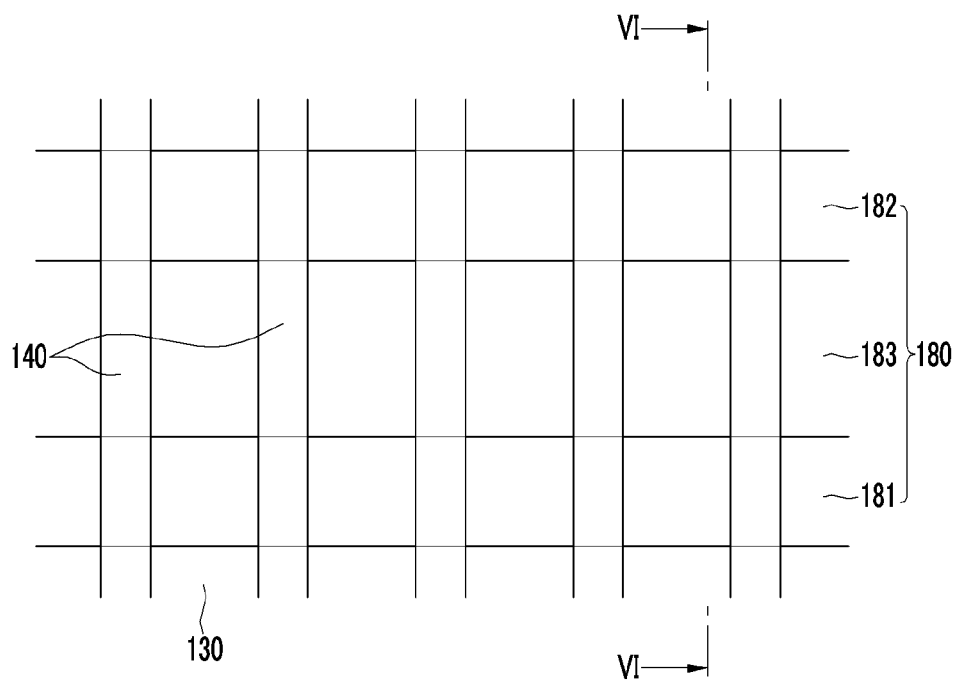
FIG. 6A illustrates a partial top plan view of a non-display area of a flexible display device according to an embodiment.
Figure 6B:
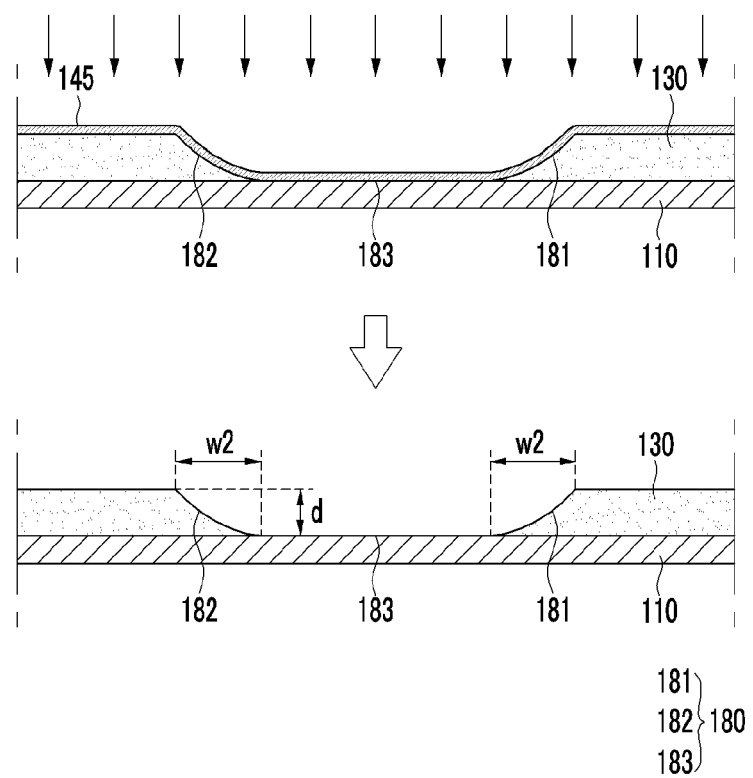
FIG. 6B illustrates a schematic cross-sectional view of the flexible display device of FIG. 6A taken along line VI-VI.

FIG. 6A illustrates a partial top plan view of a non-display area of a flexible display device according to an embodiment, and FIG. 6B illustrates a schematic cross-sectional view of the flexible display device of FIG. 6A taken along line VI-VI. In FIGS. 6A and 6B, it is assumed that a flexible substrate is flat before a bending area is formed.

Referring FIGS. 6A and 6B, the insulating layer 130 of the flexible display device 100 of the embodiment includes the cutout 180 formed in the non-display area (NDA), and the cutout 180 includes the inclined first and second lateral walls 181 and 182 satisfying the condition of 'w2≥d'. The reference symbol w2 denotes each width of the first and second lateral walls 181 and 182, and the reference symbol d denotes a depth of the cutout 180.

As the first and second lateral walls 181 and 182 are formed to have a gentle slope, a thickness of the metal layer 145 deposited on the first and second lateral walls 181 and 182 is substantially the same as that of the metal layer 145 deposited on a top surface of the insulating layer 130 and a bottom surface 183 of the cutout 180. Accordingly, when forming the plurality of wires 140 by removing a portion of the metal layer 145 by dry etching after forming the photoresist mask, the metal layer 145 disposed on the first and second lateral walls 181 and 182 is entirely removed without any remaining, thus a short circuit between the wires 140 may be prevented.

Referring back to FIG. 2, the insulating layer 130 of the non-display area (NDA) and the plurality of wires 140 are covered by the passivation layer 195 including an organic material, and in one embodiment, when the bending area (BA) is formed in the flexible substrate 110, the problem of the passivation layer 195 coming off may be suppressed. That is, since the passivation layer 195 is has excellent adherence to the first and second lateral walls 181 and 182 due to the gentle slope of the first and second lateral walls 181 and 182, it is possible to prevent the passivation layer 195 from coming off in the bending area (BA).

When the bending area (BA) is formed by bending the flexible substrate 110, tensile stress is applied to each layer included in bending area (BA).

In the flexible display device 100 of one embodiment, the first and second lateral walls 181 and 182 of the cutout 180, as shown in FIG. 6B, may have a convex shape toward the flexible substrate 110 (for example, an upward facing concave shape). Then, compressive stress caused by the downwardly convex shape is applied to layers formed on the first and second lateral walls 181 and 182, that is, the plurality of output wires 142 and the passivation layer 195.

When the bending area (BA) is formed, the compressive stress applied to the plurality of output wires 142 and the passivation layer 195 partially cancels out the tensile stress due to bending. Accordingly, the bending stress (tensile stress) applied to the plurality of output wires 142 and the passivation layer 195 decreases, and the plurality of output wires 142 and the passivation layer 195 may have a high resistance to the bending stress.

Figure 7:
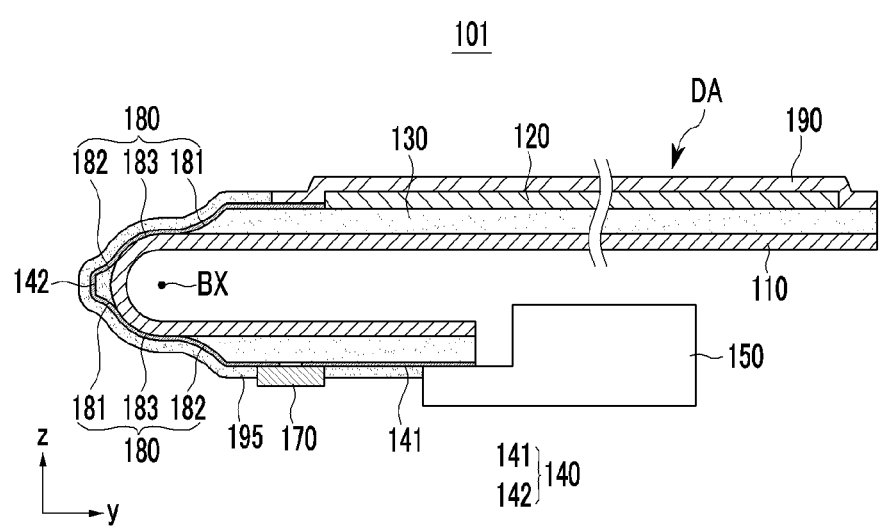
FIG. 7 illustrates a schematic cross-sectional view of a flexible display device according to another embodiment.

FIG. 7 illustrates a schematic cross-sectional view of a flexible display device according to another embodiment.

Referring to FIG. 7, an insulating layer 130 of a flexible display device 101 of another embodiment includes the plurality of cutouts 180 formed in the bending area (BA). The plurality of cutouts 180 are spaced apart from each other along the length direction of the plurality of wires 140. Each of the plurality of cutouts 180 is extendedly formed along a direction parallel to the bending axis (BX) while having a predetermined constant width.

Although two cutouts 180 are illustrated in FIG. 7, the number of cutouts 180 is not limited thereto. Since the configuration of the flexible display device 101 according to another embodiment, except for the number of the cutouts 180, is the same as that of the above-described embodiment, a duplicate description thereof will be omitted.

Hereinafter, a detailed structure of the display unit 120 and the cutout 180 will be described. However, a pixel configuration of the display unit 120 and a cross-sectional shape of the cutout 180 are not limited to the following example, and they may be variously modified.

Figure 8:
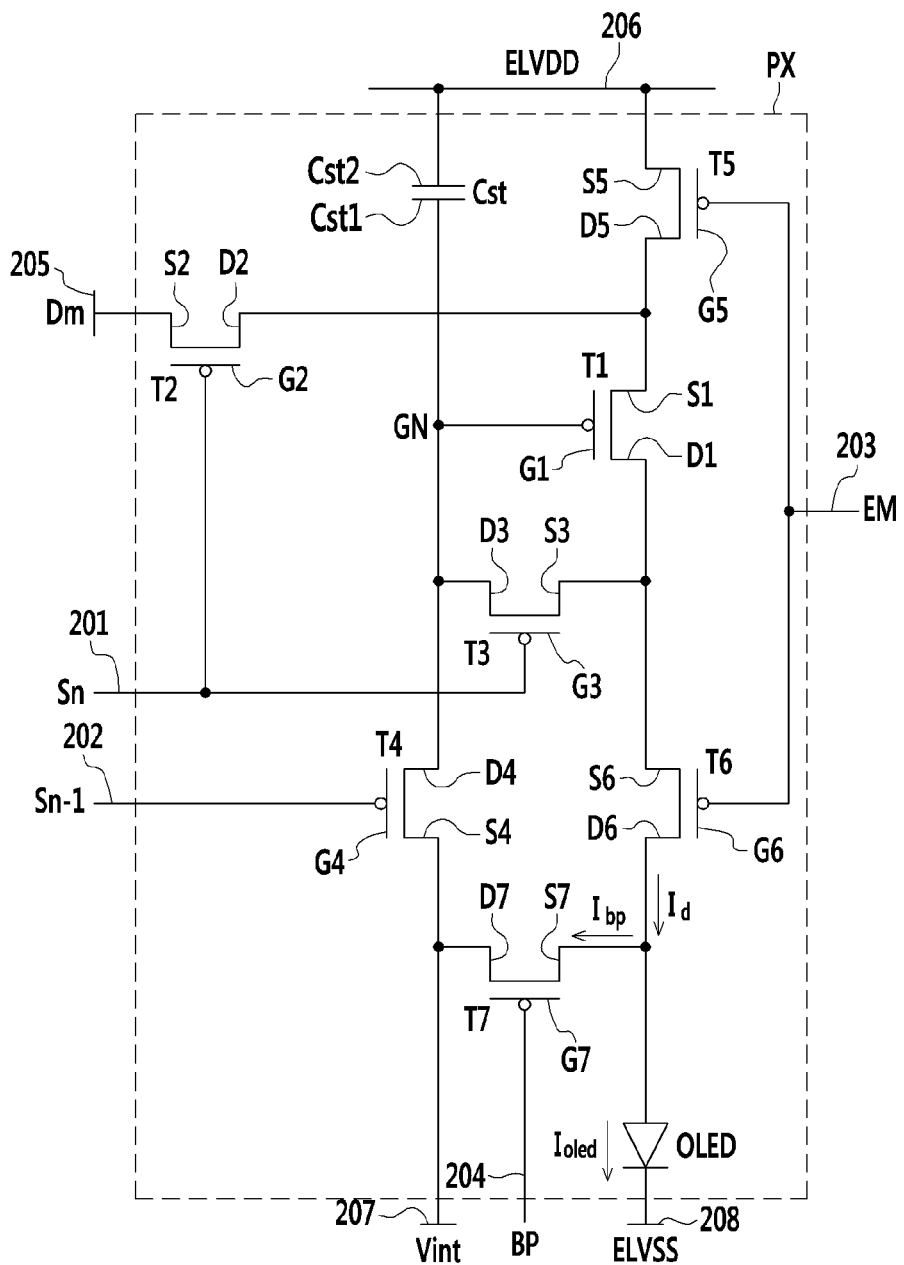
FIG. 8 illustrates an equivalent circuit diagram of one pixel shown in FIG. 1.

FIG. 8 illustrates an equivalent circuit diagram of one pixel shown in FIG. 1.

Referring to FIG. 8, one pixel includes a plurality of signal lines (201, 202, 203, 204, 205, 206, and 207), a plurality of transistors (T1, T2, T3, T4, T5, T6, and T7) connected to the plurality of signal lines, a storage capacitor (Cst), and an organic light emitting diode (OLED).

The plurality of transistors (T1, T2, T3, T4, T5, T6, and T7) include a driving transistor T1, a switching transistor T2, a compensating transistor T3, an initializing transistor T4, an operation-controlling transistor T5, a light emission-controlling transistor T6, and a bypass transistor T7.

The plurality of signal lines (201, 202, 203, 204, 205, 206, and 207) include a scan line 201 transmitting a scan signal (Sn), a previous scan line 202 transmitting a previous scan signal Sn-1 to the initializing transistor T4, a light emission-controlling line 203 transmitting a light emission-controlling signal (EM) to the operation-controlling transistor T5 and the light emission-controlling transistor T6, a bypass-controlling line 204 transmitting a bypass signal (BP) to the bypass transistor T7, a data line 205 crossing the scan line 201 and transmitting a data signal (Dm), a driving voltage line 206 transmitting a driving voltage (ELVDD) and formed to be substantially parallel to the data line 205, and an initializing voltage line 207 transmitting an initializing voltage (Vint) for initializing the driving transistor T1.

A gate electrode G1 of the driving transistor T1 is connected to one terminal Cst1 of the storage capacitor Cst. A source electrode S1 of the driving transistor T1 is connected to the driving voltage line 206 via the operation-controlling transistor T5. A drain electrode D1 of the driving transistor T1 is electrically connected to an anode of the organic light emitting diode (OLED) via the light emission-controlling transistor T6 The driving transistor T1 receives the data signal (Dm) depending on a switching operation of the switching transistor T2 to supply a current (Id) to the organic light emitting diode (OLED).

A gate electrode G2 of the switching transistor T2 is connected to the scan line 201, and a source electrode S2 of the switching transistor T2 is connected to the data line 205. A drain electrode D2 of the switching transistor T2 is connected to the source electrode S1 of the driving transistor T1, and is connected to the driving voltage line 206 via the operation-controlling transistor T5. The switching transistor T2 is turned on depending on the scan signal (Sn) transmitted through the scan line 201, and then performs a switching operation of transmitting the data signal (Dm) transmitted to the data line 205 to source electrode S1 of the driving transistor T1.

A gate electrode G3 of the compensating transistor T3 is connected to the scan line 201. A source electrode S3 of the compensating transistor T3 is connected to the drain electrode D1 of the driving transistor T1, and is connected to the anode of the organic light emitting diode (OLED) via the light emission-controlling transistor T6. A drain electrode D3 of the compensating transistor T3 is connected to a drain electrode D4 of the initializing transistor T4, the one terminal Cst1 of the storage capacitor Cst, and the gate electrode G1 of the driving transistor T1. The compensating transistor T3 is turned on depending on the scan signal (Sn) transmitted through the scan line 201, and then connects the gate electrode G1 and the drain electrode D1 of the driving transistor T1 to diode-connect the driving transistor T1.

A gate electrode G4 of the initializing transistor T4 is connected to the previous scan line 202, and a source electrode S4 of the initializing transistor T4 is connected to the initializing voltage line 207. A drain electrode D4 of the initializing transistor T4 is connected to the one terminal Cst1 of the storage capacitor Cst and the gate electrode G1 of the driving transistor T1 via the drain electrode D3 of the compensating transistor T3. The initializing transistor T4 is turned on depending on a previous scan signal Sn-1 transmitted through the previous scan line 202, and then transmits the initializing voltage (Vint) to the gate electrode G1 of the driving transistor T1 to perform an initializing operation for initializing the gate voltage of the gate electrode G1 of the driving transistor T1.

A gate electrode G5 of the operation-controlling transistor T5 is connected to the light emission-controlling line 203, and a source electrode S5 of the operation-controlling transistor T5 is connected to the driving voltage line 206. A drain electrode D5 of the operation-controlling transistor T5 is connected to the source electrode S1 of the driving transistor T1 and the drain electrode S2 of the switching transistor T2.

A gate electrode G6 of the light emission-controlling transistor T6 is connected to the light emission-controlling line 203. A source electrode S6 of the light emission-controlling transistor T6 is connected to the drain electrode D1 of the driving transistor T1 and the source electrode S3 of the compensating transistor T3. A drain electrode D6 of the light emission-controlling transistor T6 is electrically connected to the anode of the organic light emitting diode (OLED). The operation-controlling transistor T5 and the light emission-controlling transistor T6 are simultaneously turned on depending on the light emission-controlling signal (EM) transmitted through the light emission-controlling line 203, and a driving voltage (ELVDD) is compensated by the diode-connected driving transistor T1 to be transmitted to the organic light emitting diode (OLED).

A gate electrode G7 of the bypass transistor T7 is connected to the bypass-controlling line 204. A source electrode S7 of the bypass transistor T7 is connected to the drain electrode D6 of the light emission-controlling transistor T6 and the anode of the organic light emitting diode (OLED). A drain electrode D7 of the bypass transistor T7 is connected to the initializing voltage line 207 and the source electrode S4 of the initializing transistor T4. Since the bypass-controlling line 204 is connected to the previous scan line 202, a bypass signal (BP) is the same as the previous scan signal Sn-1.

The other terminal Cst2 of the storage capacitor Cst is connected to the driving voltage line 206, and a cathode of the organic light emitting diode (OLED) is connected to a common voltage line 208 transmitting a common voltage (ELVSS). Although 7 transistors and 1 capacitor are illustrated in FIG. 8, the structure of the pixel is not limited thereto, and the number of the transistors and the capacitors may be different in other embodiments.

Figure 9:
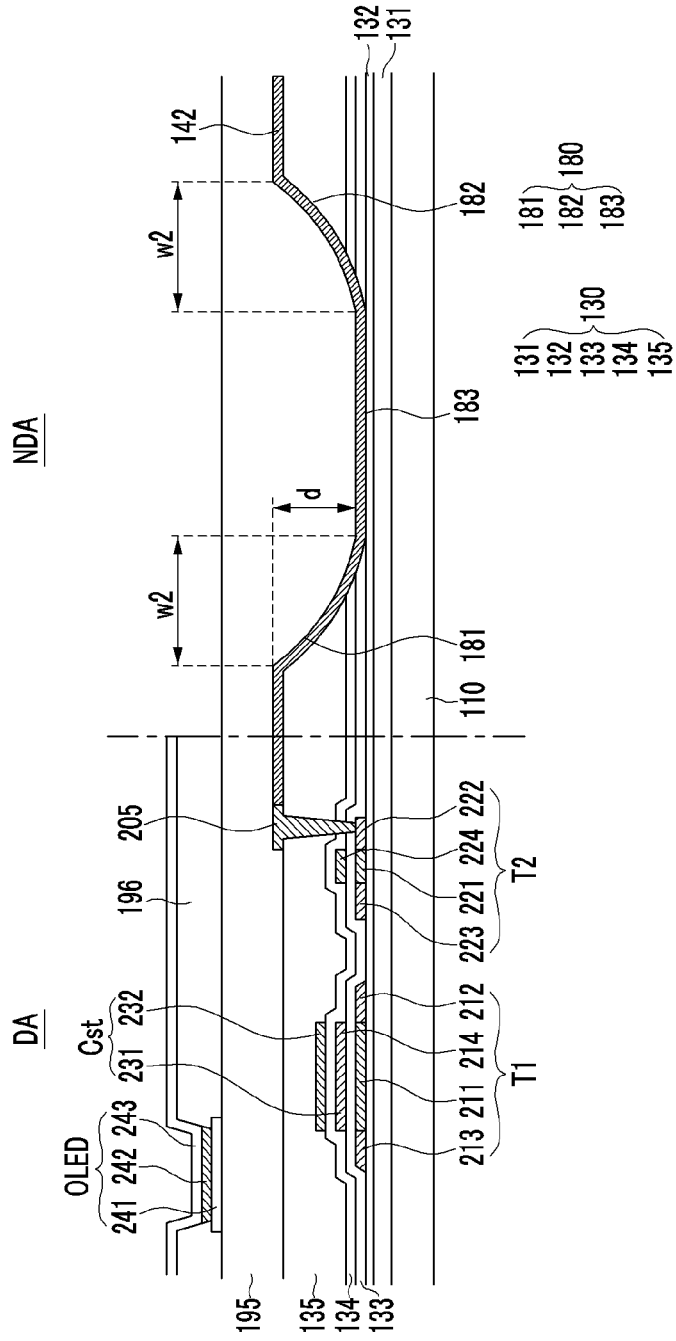
FIG. 9 illustrates an enlarged cross-sectional view of a display unit and a non-display area shown in FIG. 1.

FIG. 9 illustrates an enlarged cross-sectional view of a display unit and a non-display area shown in FIG. 1. FIG. 9 illustrates a case in which the flexible substrate is flat for better understanding and convenience, and the driving transistor T1 and the switching transistor T2 among the 7 transistors illustrated in FIG. 8 are selectively illustrated in FIG. 9.

A cross-sectional structure of the driving and switching transistors T1 and T2, the storage capacitor Cst, and the organic light emitting diode (OLED) illustrated in FIG. 9 may be different from that of an actual flexible display device. A configuration of the driving and switching transistors T1 and T2, the storage capacitor Cst, and the organic light emitting diode (OLED) are described below.

Referring to FIG. 9, a barrier layer 131 and a buffer layer 132 are formed on the flexible substrate 110. The barrier layer 131 and the buffer layer 132 serve to block impurities from the flexible substrate 110 and reduce stress applied to the flexible substrate 110 during a crystallization process for forming a polysilicon (semiconductor). The barrier layer 131 may include multiple layers including a silicon oxide layer and a silicon nitride layer, the buffer layer 132 may include a single layer of silicon oxide or silicon nitride.

A semiconductor including a driving channel 211 and a switching channel 221 is formed on the buffer layer 132. A driving source electrode 212 and a driving drain electrode 213 are formed at opposite sides of the driving channel 211 to contact the driving channel 211. A switching source electrode 222 and a switching drain electrode 223 are formed at opposite sides of the switching channel 221 to contact the switching channel 221.

A first gate insulating layer 133 is formed on the semiconductor, and a driving gate electrode 214 and a switching gate electrode 224 are formed on the first gate insulating layer 133. A second gate insulating layer 134 is formed on the driving and switching gate electrodes 214 and 224, and a second storage electrode 232 is formed on the second gate insulating layer 134. The first and second gate insulating layers 133 and 134 may include a silicon oxide, a silicon nitride, or the like.

The storage capacitor Cst includes a first storage electrode 231 and a second storage electrode 232, with the second gate insulating layer 134 disposed therebetween. The first storage electrode 231 may correspond to the driving gate electrode 214. The second gate insulating layer 134 is a dielectric material, and a storage capacitance is determined by a charge charged in the storage capacitor Cst and a voltage between the first and second storage electrodes 231 and 232.

The driving and switching transistors T1 and T2 and the storage capacitor Cst are covered by the interlayer insulating layer 135. The interlayer insulating layer 135 may include a silicon oxide or a silicon nitride. The data line 205 is formed on the interlayer insulating layer 135. The data line 205 is connected to the source electrode 222 of the switching transistor T2 through a contact hole formed in the interlayer insulating layer 135 and the first and second gate insulating layers 133 and 134.

The data line 205 is covered by the passivation layer 195, and the organic light emitting diode (OLED) is formed on the passivation layer 195. The passivation layer 195 may include an organic material. The drain electrode 213 of the driving transistor T1 is electrically connected to the anode of the organic light emitting diode (OLED) via the light emission-controlling transistor (not shown).

The organic light emitting diode (OLED) includes a pixel electrode 241, an organic emission layer 242, and a common electrode 243. The pixel electrode 241 may be an anode, which is a hole injection electrode, and the common electrode 243 may be a cathode, which is an electron injection electrode. The pixel electrode 241 and the common electrode 243 respectively inject holes and electrons into the organic emission layer 242, and light emits when excitons, combinations of the injected holes and electrons in the organic emission layer 242, enter a ground state from an excited state.

Reference numeral 196 denotes a pixel defining layer for defining a light emission region of each pixel in FIG. 9. The pixel defining layer 196 may include a polyacrylate-based resin, a polyimide-based resin, or a silica-based inorganic material. The display unit 120 may be covered by a sealing part, which is not shown. The sealing part may include a first inorganic layer covering the common electrode 243, an organic layer covering the first inorganic layer, and a second inorganic layer covering the organic layer.

The barrier layer 131, the buffer layer 132, the first and second gate insulating layers 133 and 134, and the interlayer insulating layer 135 form the insulating layer 130, which is formed on the entire flexible substrate 110. The cutout 180 is formed in at least one layer including the interlayer insulating layer 135, which is the topmost layer of the insulating layer 130 formed of multiple layers.

For example, the cutout 180 may be formed in the interlayer insulating layer 135, in the interlayer insulating layer 135 and the second gate insulating layer 134, in the interlayer insulating layer 135 and the first and second gate insulating layers 133 and 134, in the interlayer insulating layer 135, the first and second gate insulating layers 133 and 134, and the buffer layer 132, or in the entire multiple layers from the interlayer insulating layer 135 to the barrier layer 131. FIG. 9 illustrates one example in which the cutout 180 is formed in the interlayer insulating layer 135 and the first and second gate insulating layers 133 and 134.

The cutout 180 includes the inclined first and second lateral walls 181 and 182, and the width w2 of each of the first and second lateral walls 181 and 182 is equal to or greater than the depth (d) of the cutout 180. In FIG. 9, the depth (d) of the cutout 180 is equal to the total thickness of the interlayer insulating layer 135 and the first and second gate insulating layers 133 and 134. Each of the first and second lateral walls 181 and 182 may have a convex shape toward the flexible substrate 110 for example, an upward facing concave shape).

The plurality of output wires 142 (FIG. 9 illustrates one output wire) contact the data line 205, and may include the same material as that of the data line 205. The output wire 142 extends from the data line 205 along a top surface of the interlayer insulating layer 135, the first lateral wall 181, the bottom surface 183 of the cutout 180 (a top surface of the buffer layer 132 in FIG. 9), the second lateral wall 182, and the top surface of the interlayer insulating layer 135 to the driving integrated circuit (not shown). The passivation layer 195 covers the plurality of output wires 142 and the insulating layer 130 of the non-display area (NDA).

Figure 10:
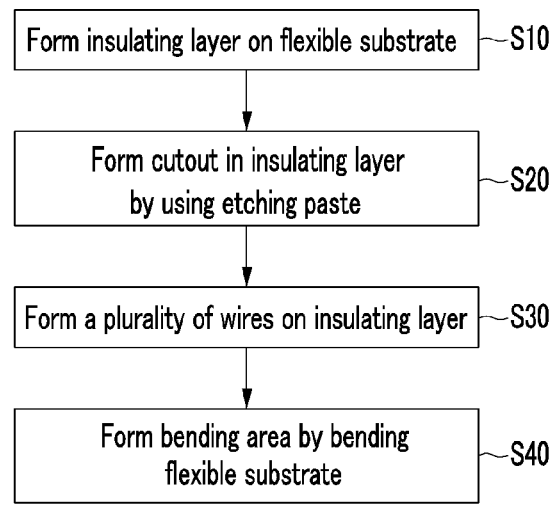
FIG. 10 illustrates a process flowchart of a manufacturing method of a flexible display device according to an embodiment.

FIG. 10 illustrates a process flowchart of a manufacturing method of a flexible display device according to an embodiment.

Referring to FIG. 10, a manufacturing method of a flexible display device includes: forming an insulating layer in a display area and a non-display area of a flexible substrate (S10); forming a cutout in the insulating layer of the non-display area by using an etching paste (S20); forming a plurality of wires on the insulating layer in which the cutout is formed (S30); and forming a bending area by bending the non-display area in which the cutout is formed (S40).

Figure 11A:
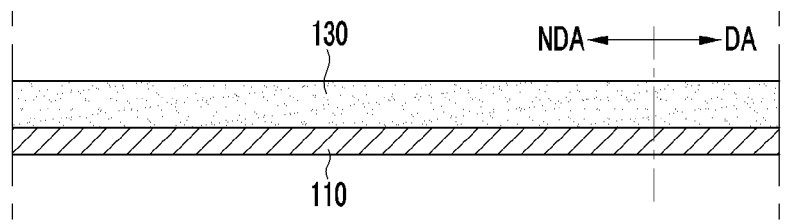
FIG. 11A illustrates a schematic cross-sectional view of a flexible display device at a first step shown in FIG. 10.

FIG. 11A illustrates a schematic cross-sectional view of a flexible display device at S10 shown in FIG. 10.

Referring to FIG. 11A, a flexible substrate 110 is prepared at S10. Next, the flexible substrate 110 is divided into a display area (DA) in which a display unit is disposed and a non-display area (NDA) outside the display area (DA). An insulating layer 130 is formed on both the display area (DA) and the non-display area (NDA) of the flexible substrate 110. Although not illustrated, a plurality of transistors and a storage capacitor are formed in the display area (DA) while forming the insulating layer 130.

Figure 11B:
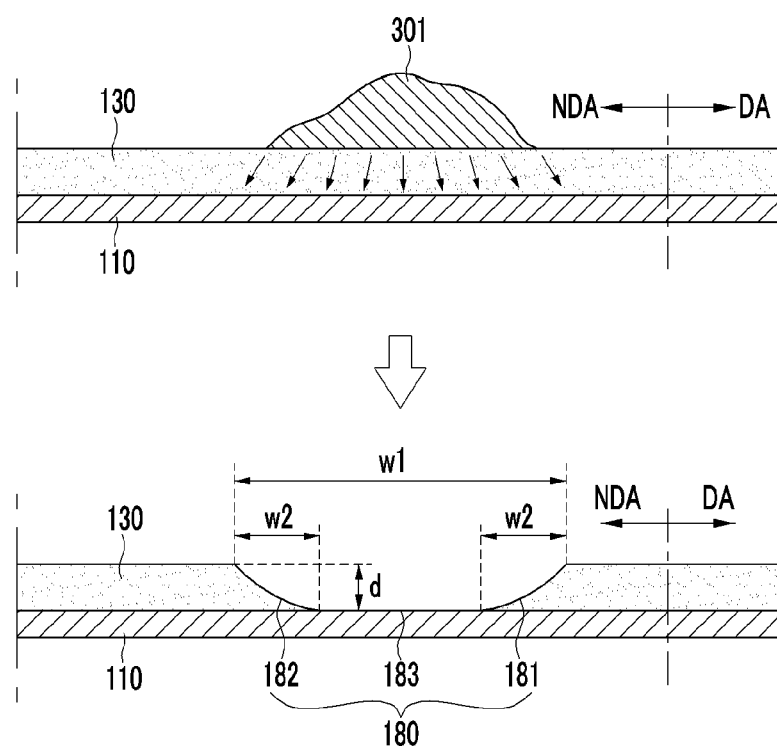
FIG. 11B illustrates a schematic cross-sectional view of a flexible display device at a second step shown in FIG. 10.

FIG. 11B illustrates a schematic cross-sectional view of a flexible display device at S20 shown in FIG. 10.

Referring to FIG. 11B, a cutout 180 is formed in the insulating layer 130 by coating an etching paste 301 on the insulating layer 130 of the non-display area (NDA). The etching paste 301 may be coated by a method such as screen printing or inkjet printing, and it is selectively coated on a portion in which the cutout 180 is formed. The etching paste 301 may selectively etch an inorganic insulation material such as, for example, a silicon oxides or a silicon nitride.

The etching paste 301 has an isotropic etching characteristic, unlike dry etching. A direction in which the etching proceeds is shown by arrows in FIG. 11B. Due to isotropic etching characteristics of the etching paste 301, the width w1 of the cutout 180 formed on the insulating layer 130 is greater than that of the initially coated etching paste 301, and the first and second lateral walls 181 and 182 of the cutout 180 respectively have a gentle slope.

For example, the width w2 of each of the first and second lateral walls 181 and 182 is equal to or greater than the depth (d) of the cutout 180, and more specifically, the width w2 of each of the first and second lateral walls 181 and 182 may be about 10 to about 50 times the depth (d) of the cutout 180. In addition, the first and second lateral walls 181 and 182 formed by the etching paste 301 have a convex shape toward the flexible substrate 110 (for example, an upward facing concave shape) due to the isotropic etching characteristic of the etching paste 301.

It is possible to control the etching depth by the etching paste 301, for example, the depth of the cutout 180, by adjusting an etching time at S20. Since the etching process using the etching paste 301 is performed at a room temperature of about 15° C. to about 25° C., thermal stress is not applied to the flexible substrate 110 and the insulating layer 130 during the etching process.

As described above, when the etching paste 301 is used, the very gentle lateral walls 181 and 182, the slope of which is less than an angle of about 45°, may be easily formed, and the lateral walls 181 and 182 having the convex shape toward the flexible substrate 110 may be easily formed.

Figure 11C:
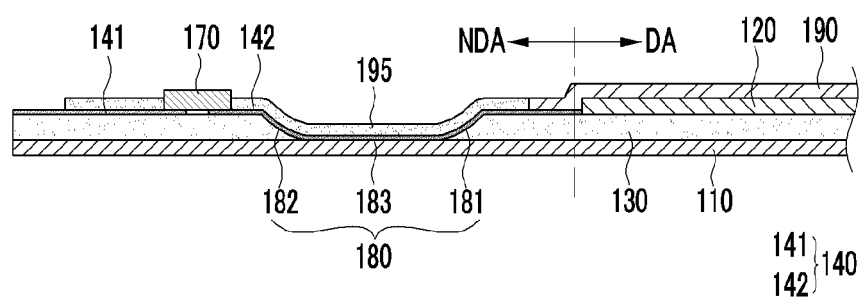
FIG. 11C illustrates a schematic cross-sectional view of a flexible display device at a third step shown in FIG. 10.

FIG. 11C illustrates a schematic cross-sectional view of a flexible display device at a third step shown in FIG. 10.

Referring to FIG. 11C, a plurality of wires 140 (FIG. 11C illustrates one wire) are formed on the insulating layer 130 of the non-display area (NDA) at S30. As described with reference to FIGS. 6A and 6B, when the plurality of wires 140 are formed by patterning the metal layer, since the metal layer does not remain in an unintended portion, a short circuit between the wires 140 may be prevented.

In addition, a driving integrated circuit 170 is mounted on the non-display area (NDA), and a passivation layer 195 is formed on the entire non-display area (NDA). As the first and second lateral walls 181 and 182 of the cutout 180 have convex shape toward the flexible substrate 110, a compressive stress is applied to the plurality of output wires 142 and the passivation layer 195 formed on the first and second lateral walls 181 and 182.

Figure 11D:
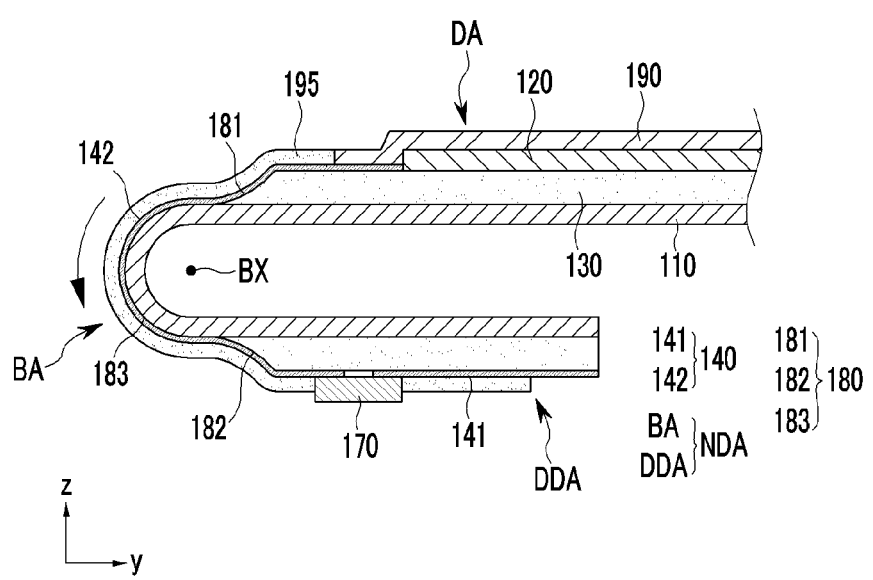
FIG. 11D illustrates a schematic cross-sectional view of a flexible display device at a fourth step shown in FIG. 10.

FIG. 11D illustrates a schematic cross-sectional view of a flexible display device at S40 shown in FIG. 10.

Referring to FIG. 11D, a bending area (BA) is formed by a portion of the non-display area (NDA), in which the cutout 180 is formed by being bent at S40. Since the remaining non-display area (NDA) (for example, the data driver area), except for the bending area (BA), overlaps the display area (DA) at a rear side of the display area (DA), dead space outside the display unit 120 decreases.

When the bending area (BA) is formed, a tensile stress is applied to the plurality of output wires 142 and the passivation layer 195, and a compressive stress is applied to the plurality of output wires 142 and the passivation layer 195 before the bending partially cancels the tensile stress due to the bending. Accordingly, the bending stress applied to the plurality of output wires 142 and the passivation layer 195 decreases.

In addition, as described with reference to FIG. 6C, adhesion of the passivation layer 195 may be improved due to the gentle slope of the first and second lateral walls 181 and 182 of the cutout 180, and it is possible to suppress the defect in which the passivation layer 195 of the bending area (BA) comes off.

While this disclosure has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A flexible display device comprising:
a flexible substrate including a bending area;
an insulating layer formed on the flexible substrate and including at least one cutout formed to correspond to the bending area; and
a plurality of wires formed along a surface shape of the insulating layer in the bending area,
wherein the at least one cutout includes an inclined lateral wall,
wherein a width of the inclined lateral wall is greater than a depth of the cutout,
wherein the inclined lateral wall includes a first lateral wall and a second lateral wall spaced apart from each other,
wherein a bottom surface of the at least one cutout is disposed between the first lateral wall and the second lateral wall, and
wherein the plurality of wires are formed along a top surface of the insulating layer, the first lateral wall, the bottom surface, the second lateral wall, and a top surface of the insulating layer.

2. The flexible display device of claim 1, wherein the inclined lateral wall has a convex shape toward the flexible substrate.

3. The flexible display device of claim 1, wherein a plurality of cutouts are formed, and
the plurality of cutouts are spaced apart from each other along a length direction of the plurality of wires.

4. The flexible display device of claim 1, wherein the bending area is bent based on a bending axis, and
the at least one cutout is extendedly formed along a direction parallel to the bending axis.

5. The flexible display device of claim 1, wherein the at least one cutout is formed by an isotropic etching using an etching paste.

6. The flexible display device of claim 1, wherein the inclined lateral wall has a downward convex shape.

7. The flexible display device of claim 6, wherein the bending area is bent based on a bending axis, and
the cutout is extendedly formed along a direction parallel to the bending axis.

8. The flexible display device of claim 1, wherein the flexible substrate includes a display area and a non-display area, and
the bending area is included in the non-display area.

9. The flexible display device of claim 8, further comprising
a display unit formed in the display area on the flexible substrate,
wherein the plurality of wires are electrically connected to a plurality of signal lines included in the display unit.

10. The flexible display device of claim 9, further comprising
a driving integrated circuit and a plurality of pad electrodes formed in the non-display area and electrically connected to the plurality of wires.

11. The flexible display device of claim 10, wherein the driving integrated circuit and the plurality of pad electrodes overlap the display unit in a rear side of the display unit by the bending area.

12. The flexible display device of claim 8, wherein the insulating layer includes a multi-layered inorganic layer, and
the at least one cutout is formed in at least one layer including a topmost layer of the multi-layered inorganic layer.

13. The flexible display device of claim 8, wherein the insulating layer of the non-display area and the plurality of wires are covered by a passivation layer including an organic material.

14. A flexible display device comprising:
a display area in which a display unit is formed;
a bending area contacting one side of the display area; and
a data driver area contacting one side of the bending area and overlapping the display area,
wherein an insulating layer including a cutout and a plurality of wires formed along a surface shape of the insulating layer are disposed in the bending area, and
the cutout includes an inclined lateral wall, and a width of the inclined lateral wall is greater than a depth of the cutout,
wherein the inclined lateral wall includes a first lateral wall and a second lateral wall spaced apart from each other,
wherein a bottom surface of the cutout is disposed between the first lateral wall and the second lateral wall, and
wherein the plurality of wires are formed along a top surface of the insulating layer, the first lateral wall, the bottom surface, the second lateral wall, and a top surface of the insulating layer.

15. A manufacturing method of a flexible display device, comprising:
forming an insulating layer on a flexible substrate;
forming a cutout by isotropic etching in the insulating layer by using an etching paste, the cutout including an inclined lateral wall and a width of the lateral wall being greater than a depth of the cutout, wherein a depth of the cutout is controlled by adjusting an etching time of the etching paste;
forming a plurality of wires along a surface shape of the insulating layer in which the cutout is formed; and
forming a bending area by bending a portion of the flexible substrate in which the cutout is formed.

16. The manufacturing method of the flexible display device of claim 15, wherein
 the lateral wall has a convex shape toward the flexible substrate.

17. The manufacturing method of the flexible display device of claim 15, wherein
 the bending area is bent based on a bending axis, and
 the cutout is extendedly formed along a direction parallel to the bending axis.

\* \* \* \* \*